United States Patent [19]
Henning

[11] Patent Number: 4,736,164
[45] Date of Patent: Apr. 5, 1988

[54] OPTICAL AMPLIFICATION
[75] Inventor: Ian D. Henning, Ipswich, England
[73] Assignee: British Telecommunications plc, United Kingdom
[21] Appl. No.: 762,865
[22] Filed: Aug. 6, 1985
[30] Foreign Application Priority Data
  Aug. 6, 1984 [GB] United Kingdom .................. 8420013
  Oct. 2, 1984 [GB] United Kingdom .................. 8424860
[51] Int. Cl.⁴ .......................... H01L 15/00; H01S 2/20
[52] U.S. Cl. ........................................ 330/4.3; 372/29; 307/425; 357/30
[58] Field of Search ..................... 330/4.3, 4.9; 372/21, 372/29, 44, 32, 46; 307/425; 455/601, 610; 357/19, 30

[56] References Cited
U.S. PATENT DOCUMENTS
3,506,925 4/1970 Groschwitz .......................... 330/4.3
3,724,926 4/1973 Lee ....................................... 330/4.3
3,828,231 8/1974 Yamamoto ........................... 330/4.3
4,292,606 9/1981 Trimmel ............................... 372/29
4,450,564 5/1984 Meuleman et al. ................... 372/29
4,577,328 3/1986 Yoshihawa et al. .................. 372/29

OTHER PUBLICATIONS
Henning et al, "Performance Predictions . . . Model", IEEE J.Q.E., vol. QC-21, #6, pp. 609–613, 6/85.
Westbrook et al, "Spectral Properties . . . Lower Diodes", IEEE J.Q.E., vol. QE-21, pp. 512–518, 6/85.
Virnik et al, "Natural Frequency . . . Line", Radiophys & Quantum Electron (U.S.A.), vol. 14, #1, 1/71, pp. 135–136.

Primary Examiner—Nelson Moskowitz
Attorney, Agent, or Firm—Nixon & Vanderhye

[57] ABSTRACT

Light is amplified in a semiconductor laser structure through which a current is passed and (a) the wavelength of the light is greater than the wavelength of maximum gain of the laser structure, or (b) injection locking is avoided, or (c) the current is controlled so as at least partly to compensate for the decrease in the monitored light output at a wavelength or over a wavelength range distinct from that of the emitted amplified signal.

In this way relatively high input powers can be amplified.

24 Claims, 4 Drawing Sheets

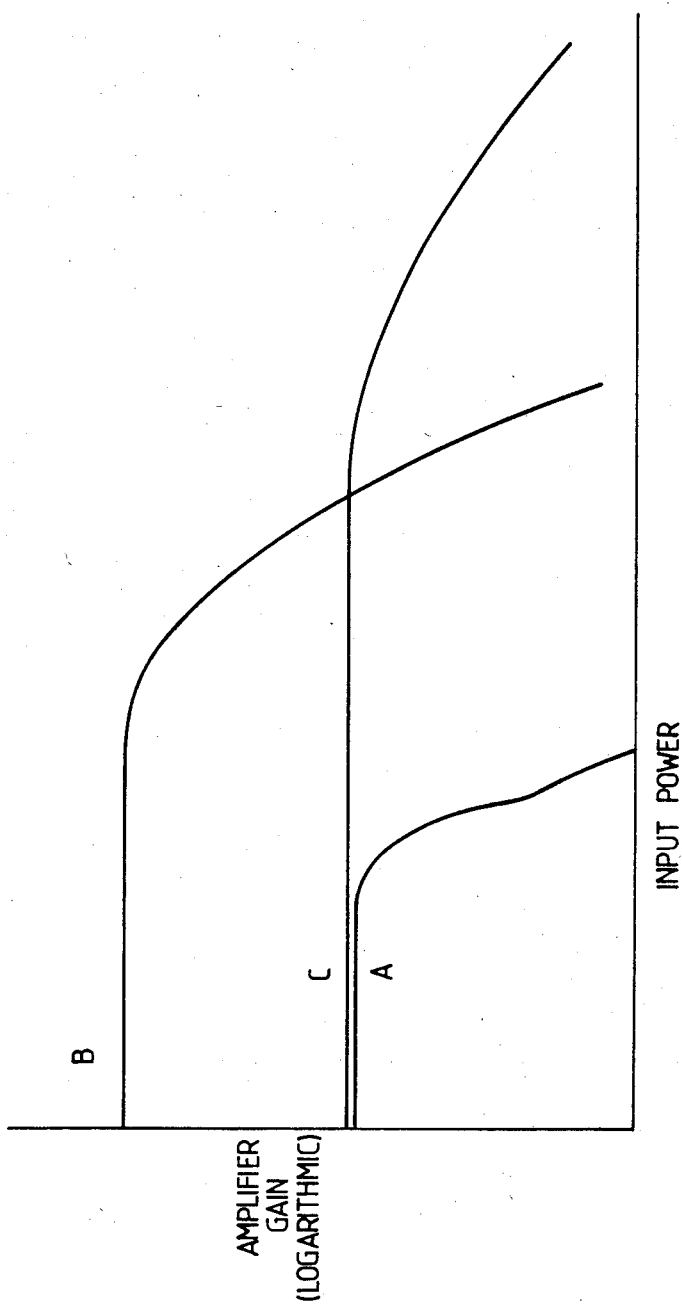

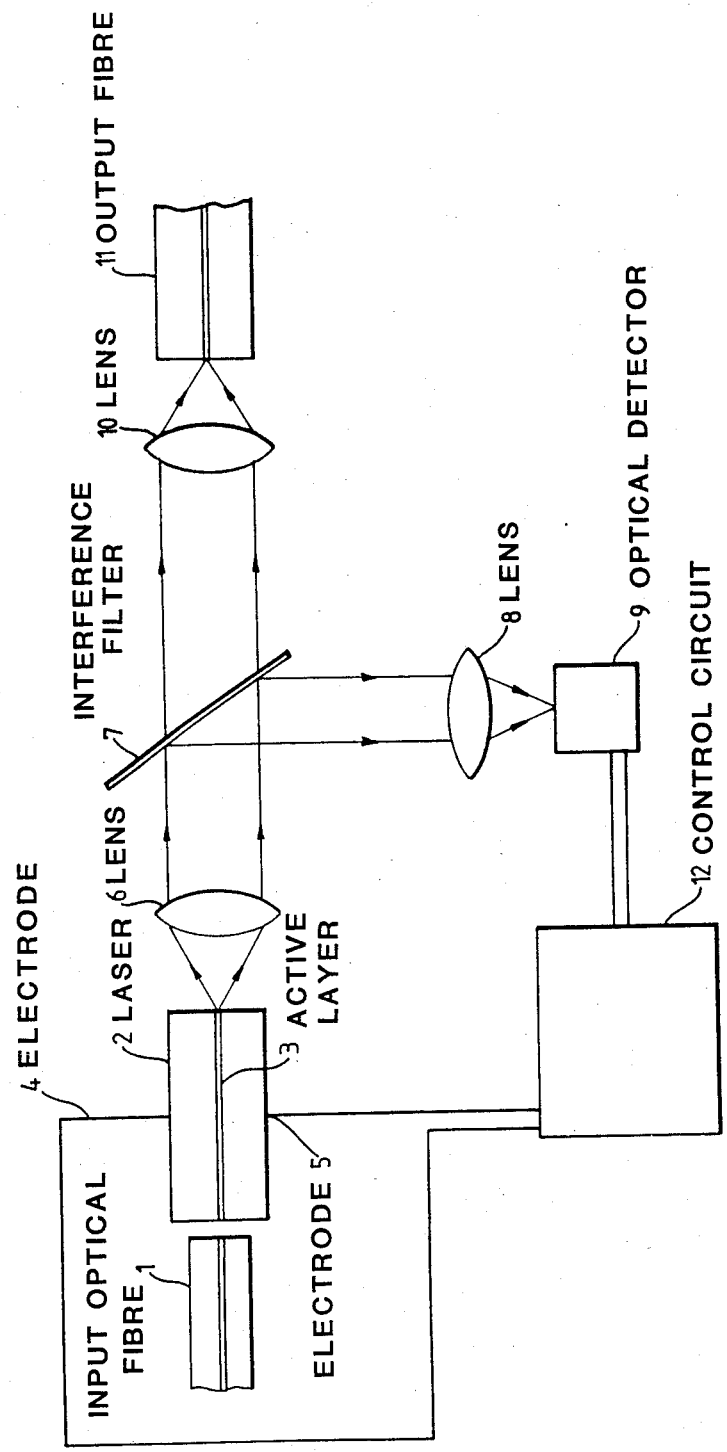

OPTICAL AMPLIFICATION

FIELD OF THE INVENTION

The present invention relates to the amplification of optical signals.

BACKGROUND AND SUMMARY OF THE INVENTION

The amplification of optical signals is of especial importance in optical communications. The radiation used in optical communications is not necessarily in the visible region, and the words "optical" and "light" when used in this specification are not to be interpreted as implying any such limitation. Indeed, if silica optical fibres are used as the transmission medium, infra-red radiation is of especial usefulness because the loss minima occur in such fibres at 1.3 µm and 1.55 µm approximately.

A semiconductor laser comprises in general an "active layer" of low band gap material with higher band gap "confinement" layers to either side and a p-n junction in the vicinity of the active layer. When current is passed from p- to n-type material, electrons and holes combine in the active layer to generate light. The threshold current at which the onset of "lasting" occurs depends on the degree of feedback into the structure, e.g. by reflections from its end faces, on the (current dependent) gain through stimulated emission as photons pass along the active layer, and on other factors. At lower currents, the laser functions as a light emitting diode or as a superluminescent emitter. A laser in which the feedback is provided by reflections at end facets is known as a Fabry-Perot laser.

It is known that a semiconductor laser structure can be used as an optical amplifier. Thus, it is known that if a laser structure is chosen having a wavelength of maximum gain close to the wavelength of the optical signal to be amplified and this signal is coupled into its active layer then it can be amplified if a driving current of less than the threshold value is passed through the structure from p- to n-type material. The phrase "laser structure" is used here and elsewhere in this specification to indicate the similarity of the amplifier structure to that of a laser without necessarily implying that lasing actually occurs in use.

We have given attention to the characteristic of such amplifiers that the amplifier gain for a given driving current is substantially constant from zero input power over a range of lower powers and then decreases to zero and then becomes negative (i.e. net absorption occurs) with higher powers. This is at least partly because the device saturates as the proportion of the available holes and electrons consumed increases. Increasing the driving current can be used to increase the supply of holes and electrons and therefore the gain; however, the extent to which this can be done is limited, because around the lasing threshold of the device injection-locked lasing occurs whereafter the dependence on the power input of the power output at the single emission wavelength is slight, i.e. useful amplification does not occur.

An object of the present invention is to provide means for amplifying higher input powers.

The present invention in its first aspect is based on our surprising discovery that the effects of saturation are less marked on the long-wavelength side of the wavelength of maximum gain as measured for lower powers.

In its first aspect the present invention provides a method of amplifying an optical signal which comprises coupling the optical signal to be amplified into the active layer of a semiconductor laser structure through which a driving current is passed, the amplified signal being emitted from the active layer, in which method the wavelength of the gain maximum at that driving current for the low power limit of optical power input $\lambda_{max}$, the longer of the two wavelengths of zero gain at the driving current for the low power limit of optical power input $\lambda_{upper}$, and the wavelength of the optical signal to be amplified $\lambda$ are related by the equation $$\lambda_{upper} > \lambda > \lambda_{max}.$$

In its first aspect the present invention further provides an amplification assembly for amplifying an optical signal which comprises an optical signal source, a semiconductor laser structure, means for coupling the optical signal to be amplified into the active laser of the semiconductor laser structure, and means for passing a driving current through the semiconductor laser structure, the amplified signal being emitted from the active layer in use, wherein the wavelength of the gain maximum of the semiconductor laser structure at that driving current for the low power limit of optical power input $\lambda_{max}$, the longer of the two wavelengths of zero gain at the driving current $\lambda_{upper}$, and the wavelength of the optical signal to be amplified $\lambda$ are related by the equation $$\lambda_{upper} > \lambda > \lambda_{max}.$$

Preferably, $(\lambda - \lambda_{max})/(\lambda_{upper} - \lambda_{max})$ is at least 0.1, especially at least 0.2.

In a second aspect, our invention is based on our appreciation that if the input wavelength is sufficiently remote from the wavelength of he laser gain maximum to avoid injection-locking, whether on the high side or the low side, useful amplification of the input signal can be obtained with currents in excess of the threshold current.

In its second aspect, therefore, the present invention provides a method of amplifying an optical signal which comprises coupling the signal to be amplified into the active layer of a semiconductor laser structure and applying a driving current to the laser structure such that lasing occurs, the wavelength of the signal to be amplified being such that injection locking is avoided and the amplified signal is emitted from the active layer.

In its second aspect, the present invention further provides an amplification assembly for amplifying an optical signal which comprises an optical signal source, a semiconductor laser structure, means for coupling the optical signal to be amplified into the active layer of the semiconductor laser structure, and means for passing a driving current through the semiconductor laser structure such that lasing occurs, the wavelength of the signal to be amplified being such that injection locking is avoided and the amplified signal being emitted from the active layer.

In a third aspect, the present invention is based on our appreciation that the output of a laser structure under use as an optical amplifier is diminished over its entire emission range (not merely at the wavelength of the input signal) by the saturation referred to above and that this diminution offers a means of controlling the current so as to raise up the amplifier gain at higher input powers.

In this third aspect, therefore, the present invention provides a method of amplifying an optical signal which comprises coupling the signal to be amplified into the active layer of a semiconductor laser structure through which a driving current is passed, which layer emits the amplified signal, and monitoring the light emission from the active layer at a wavelength or over a wavelength range distinct from that of the amplified signal, and controlling the driving current to the laser structure so as at least partly to compensate for the decrease in the monitored output with increasing optical input.

In its third aspect, the present invention further provides an amplification assembly for amplifying an optical signal which comprises an optical signal source, a semiconductor laser structure, means for coupling the optical signal to be amplified into the active layer of the semiconductor laser structure, and means for passing a driving current through the semiconductor laser structure, the amplified signal being emitted from the active layer in use, wherein means is provided to monitor the output of the semiconductor laser structure at a wavelength or over a wavelength range distinct from that of the amplified signal, and a feedback control loop is provided which acts to control the driving current so as at least partly to compensate for the decrease in the monitored output with increased optical input power.

The invention can be employed independently in each of its three aspects, or in all three simultaneously, or in any of the three possible combinations of two aspects. In its first and third aspects, the invention can even be applied to a laser structure with so little feedback that it cannot be made to lase at any practical current (e.g. a travelling wave amplifier).

BRIEF DESCRIPTION OF THE DRAWINGS

The invention will now be described by way of example only, with respect to the accompanying FIGS. 1 to 4 in which:

FIG. 3 shows (schematically, smoothed, and generalised) the results of calculations such as those selected for inclusion in FIG. 2; and FIG. 4 shows, schematically and not to scale, a semiconductor laser amplification assembly which is an embodiment of the present invention in all three aspects.

DETAILED DESCRIPTION

Figure 1:
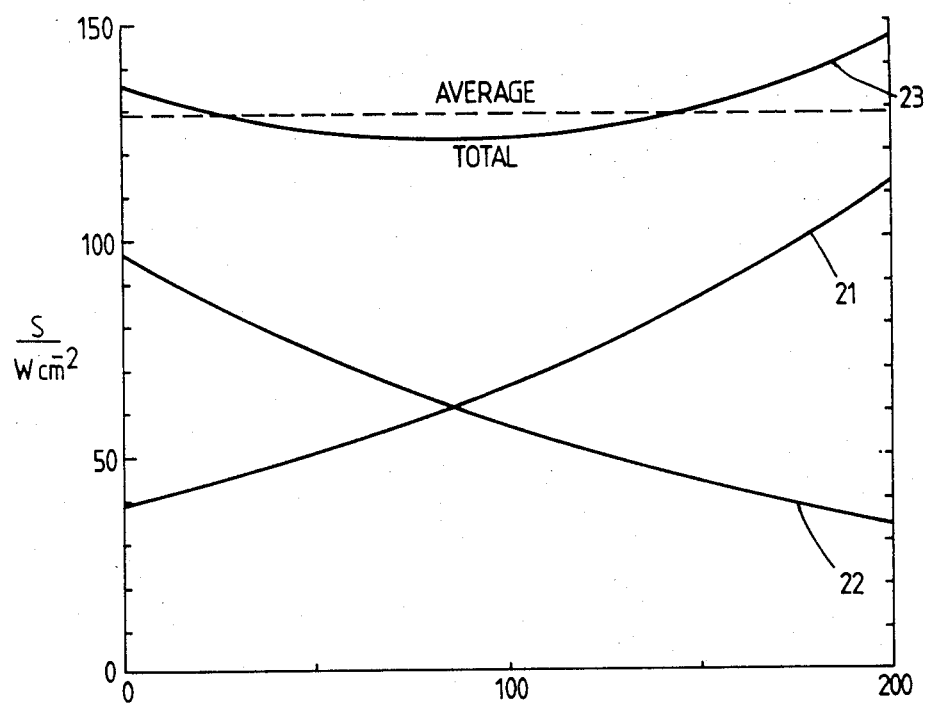
FIG. 1 shows the photon distribution along the cavity of a semiconductor laser amplifier.

FIG. 1 shows how in a typical semiconductor laser amplifier the signal intensity S varies with length along the cavity of the amplifier. The signal intensity S comprises two components 21, 22 representing the forward and reflected waves travelling in opposed directions along the amplifier. The variation in signal intensity S along the length l of the amplifier leads to consequent variation in carrier density and gain.

We have constructed an analytical model of the laser amplifier in which the total axial photon distribution 23 is averaged over the cavity length and used to self-consistently determine a uniform carrier density. We have incorporated the refinement of a spectrally dependent gain function (the peak of which shifts with the carrier density) and the effect of carrier density on the refractive index within the cavity.

Figure 2:
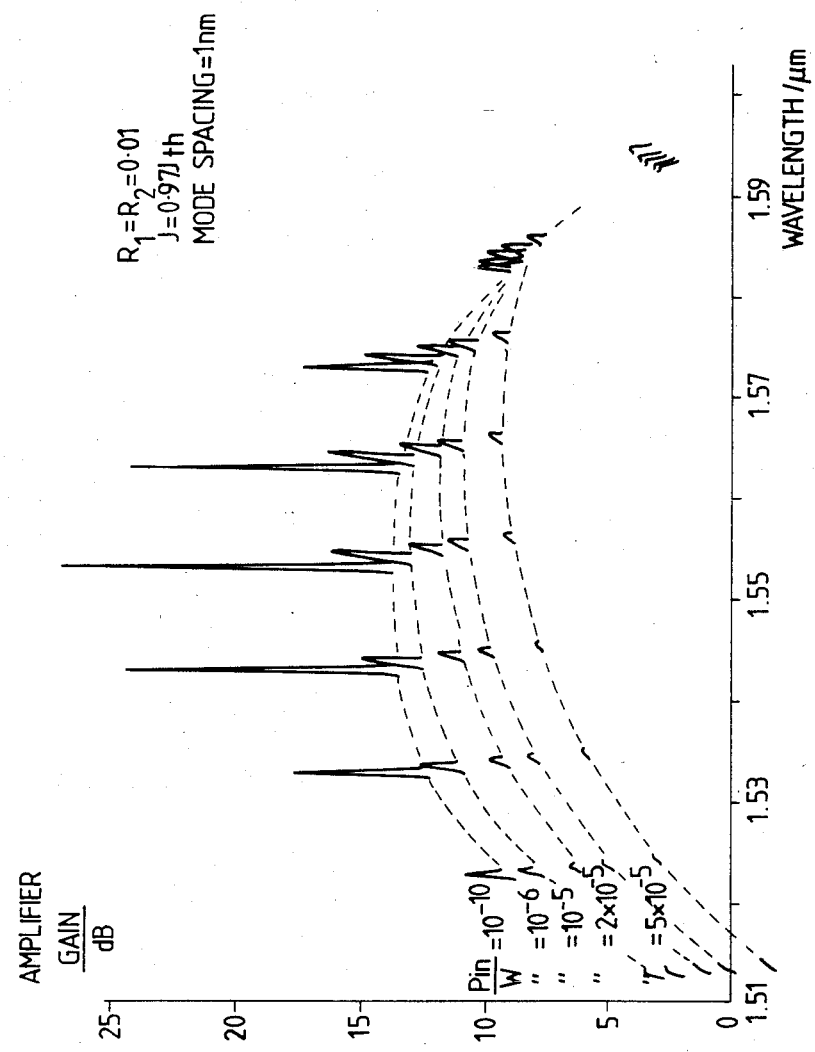
FIG. 2 shows the gain characteristics at different input powers of a particular semiconductor laser amplifier as calculated by means of a computer model (only selected results being shown)

FIG. 2 shows results for the gain characteristics obtained by use of this model for a Fabry-Perot laser amplifier operable near the 1.55 $\mu$m loss minimum of silica fibres in which the reflectivity of each end facet is taken to be 0.01. The current density is taken to be 0.97 times the threshold current density. The mode spacing of the laser is taken as 1 nm. The detailed results of calculations for various input powers are shown only for selected wavelengths so as to avoid congestion. The dotted lines which connect the results shown represent the general trend of the gain characteristics between these results without including detail.

It will be seen that the gain characteristics, as well as depending on wavelength and input power, show Fabry-Perot resonances. At the lowest input power the trend in the characteristics follows the trend of the material gain spectrum with the largest values of the amplification occurring at the gain peak at 1.5525 $\mu$m. With increasing input power the carrier density decreases. This reduces the amplification overall and shifts the gain peak to longer wavelengths as well as modifying the carrier-dependent refractive index.

It can be seen that the gain peak shifts according to the following Table:

TABLE 1

| Input power/W | Gain peak input wavelength/$\mu$m |
|---|---|
| $10^{-10}$ | 1.5525 |
| $10^{-6}$ | 1.5572 |
| $10^{-5}$ | 1.5620 |
| $2 \times 10^{-5}$ | 1.5650 |
| $5 \times 10^{-5}$ | 1.5675 |

Hence when the input power is increased from $10^{-10}$W to $10^{-6}$W, the gain peak has already shifted to a longer wavelength; 1.5572 $\mu$m. The reduction in gain (13.7 dB to 13.0 dB) seen at the wavelength of maximum gain at low power 1.5525 $\mu$m, when the input power is increased to $10^{-6}$W, can therefore be at least partialy offset by operation at up to at least 1.5572 $\mu$m.

Referring still to FIG. 2, as the input power is further increased, increasingly significant reductions in overall amplification are seen. As the same time the gain peak is shifted to increasingly longer wavelengths. The result is that increasing benefit is available, in offsetting the overall reduction in amplification by operating at longer wavelengths, as the input power is increased from $10^{-10}$W to $10^{-6}$W, $10^{-5}$W and through the values shown to $5 \times 10^{-5}$W. It has further been observed, though not shown in FIG. 2, that particularly significant benefit can be had at input powers of the order of 1 mW, for instance at input powers of 0.5 mW to 5 mW inclusive.

In FIG. 3 the amplifier gain as a function of input power for a given current is shown for three different wavelengths, B near to the wavelength of maximum gain, A somewhere on the low wavelength side but within the positive part of the gain curve, and C on the long-wavelength side but likewise within the positive part of the gain curve, C showing a gain at lower power similar to that of curve A. The effect of Fabry-Perot resonances has been smoothed out. It will be seen from the part of the Figure where curve C lies highest why, if one wishes to amplify a higher input power at a particular wavelength, one can achieve best results (in accordance with the invention in its first aspect) by using a laser amplifier of which the maximum gain at low power is at a shorter wavelength than the signal to be amplified.

Referring again to FIG. 2, it can be seen that there is a further benefit to be gained from operating at an input wavelength which is greater than the wavelength of maximum gain at low powers. The variation in gain due to increasing input powers for the wavelength of maximum gain at low powers, and for two wavelengths selected to be longer and shorter respectively, are shown in in the following Table:

TABLE 2

| Input power/W | Gain/dB at 1.5400 μm | Gain/dB at 1.5525 μm | Gain/dB at 1.5700 μm |
|---|---|---|---|
| $10^{-10}$ | 13.4 | 13.7 | 12.7 |
| $10^{-6}$ | 12.1 | 13.0 | 12.4 |
| $10^{-5}$ | 10.4 | 11.6 | 11.5 |
| $2 \times 10^{-5}$ | 9.0 | 10.5 | 10.8 |
| $5 \times 10^{-5}$ | 7.0 | 8.6 | 9.3 |

The further benefit referred to above is that of reduced sensitivity to increases over a range of input power. It can be seen that the reduction in gain at 1.5525 μm over the range of input powers shown is just over 37% whereas the reduction in gain at 1.5700 μm is slightly less than 27%. This reduced sensitivity to increases in input power gives the amplifier the desirable feature of having a more linear gain characteristic for increasing signal input powers. In contrast, the equivalent reduction in gain at 1.5400 μm is more than 47%.

We refer now to FIG. 4.

In FIG. 4, 1 represents an optical fibre carrying an input signal of wavelength 1580 nm (1.58 μm) from an optical signal source (not shown). This is coupled from the fibre end into active layer 3 of a Fabry-Perot laser structure 2. This structure is one having a maximum gain at the low power limit of optical power input at a wavelength of 1550 nm (1.55 μm), the positive part of the gain spectrum at the low power limit of optical power input extending to 1600 nm (1.60 μm) on the long wavelength side and having an approximately similar extent to the low wavelength side. Current of above the threshold level is passed between electrodes 4 and 5 and lasing occurs in various Fabry-Perot modes distributed over the gain spectrum. Amplification occurs at the wavelength 1580 nm of the input signal. Light emerges from 3 and is fed via lens 6 into interference filter 7. The interference filter reflects a band of radiation near to 1550 nm but not significantly the radiation at 1580 nm to lens 8 and optical detector 9. The signal including the amplified 1580 nm signal continues to lens 10 and the output optical fibre 11. $(\lambda - \lambda_{max})/(\lambda_{upper} - \lambda_{max})$ as defined above is 0.6.

In accordance with the invention in its first aspect, the gain for high input powers from fibre 1 is higher than would have been the case had the wavelength of maximum gain of laser 2 been at 1.58 μm for the lower power limit. In accordance with the invention in its second aspect, the difference between λ and $\lambda_{max}$ is such that amplification occurs even for currents of above threshold, and this higher permitted current makes also for high gain. (This latter effect would be present even had the input radiation been at (say) 1.52 μm, i.e. had the first aspect of the invention not been exploited.)

In the Figure, a further although independent benefit is afforded, in accordance with the present invention in its third aspect, by the use of a feedback control loop. The loop comprises the filter 7, the lens 8, the detector 9 and the control circuit 12 which receives the output signal of the detector 9. The control circuit 12 is designed to adjust the current passed between electrodes 4 and 5 to maintain a constant output from detector 9, and thereby constant amplifier gain. This circuitry would, it should be mentioned, be of value even in operation with currents below lasing threshold.

For optimum performance in the device described, the end facets will normally be anti-reflection coated, e.g. to achieve reflectivities of 0.01.

Semiconductor laser structures other than that described above may be employed. However, their characteristics, such as the input power at which significant benefits may be gained by application of the present invention, will vary from those described above.

One use of the device shown, and indeed generally of methods and amplification assemblies in accordance with the present invention, is in optical communications systems where the light from the laser source is passed through lossy components such as modulators or optical isolators before being coupled into the optical fibre of the communications link. Such arrangements are of especial significance for coherent optical systems. By using the device shown, the signal emerging from these lossy components can be amplified to make up for the losses. The input powers desired in such cases are in general high ones in the context of this specification, and therefore ones where the present invention affords advantages. Gains of about 10 dB are achievable even for input powers of 5 mW. Power on launch into the communications link is of course of the greatest importance in determining repeater spacings.

In such an application it is possible to use as the source laser and the amplifying laser devices that are practically identical except that the latter is anti-reflection coated. The source laser will lase at relatively low currents with a wavelength longer than that of the amplifier laser when made to lase with the relatively high currents that are necessary, and longer than the wavelength of maximum gain at low powers of the amplifier laser. In this way one can with relative ease secure the benefits in accordance with the present invention in its first aspect.

The methods and amplification assemblies in accordance with the present invention may also be used in optical pre-amplifiers, for instance before a detector at the receiving end of an optical signalling arrangement.

I claim:

1. A method of amplifying an optical signal which comprises coupling the optical signal to be amplified into the active layer of a semiconductor laser structure through which a driving current is passed, the amplified signal being emitted from the active layer, in which method the following relationship applies:

$$\lambda_{upper} > \lambda > \lambda_{max}$$

wherein
  $\lambda_{upper}$ is the longer of the two wavelengths of zero gain, at said driving current, for the low power limit of optical power input;

λ is the wavelength of the optical signal to be amplified; and

λmax is the wavelength of the gain maximum, at said driving current, for the low power limit of optical power input.

2. A method according to claim 1, wherein $$(\lambda - \lambda_{max})/(\lambda_{upper} - \lambda_{max}) \geq 0.1.$$

3. A method according to claim 1, wherein $$(\lambda - \lambda_{max})/(\lambda_{upper} - \lambda_{max}) \geq 0.2.$$

4. A method according to any preceding claim wherein $\lambda_{max}$ is in the range from 1.2 to 1.7 μm.

5. A method according to claim 1, 2 or 3 wherein the driving current is such that lasing does not occur.

6. A method according to any of claims 1 to 3, wherein the driving current is such that lasing occurs and the wavelength of the optical signal to be amplified is such that injection locking of the laser does not occur.

7. A method of amplifying an optical signal which comprises coupling the signal to be amplified into the active layer of a semiconductor laser structure and applying a driving current to the laser structure such that lasing occurs, the wavelength of the signal to be amplified being such that injection locking is avoided and the amplified signal is emitted from the active layer.

8. A method according to claim 7 wherein the output of the semiconductor laser structure is monitored at a wavelength or over a wavelength range distinct from that of the amplified signal and the driving current is controlled so as at least partly to compensate for the decrease in the monitored output with increased optical input.

9. A method of amplifying an optical signal which comprises coupling the signal to be amplified into the active layer of a semiconductor laser structure through which a driving current is passed, which layer emits the amplified signal, and monitoring the light emission from the active layer at a wavelength or over a wavelength range distinct from that of the amplified signal, and controlling the driving current to the laser structure so as at least partly to compensate for the decrease in the monitored output with increasing optical input.

10. A method according to any one of claims 1, 7 or 9, wherein the signal to be amplified has a power which lies in the range from 1 μW to 5 mW inclusive.

11. A method according to any one of claims 1, 7 or 9, wherein the signal to be amplified has a power which lies in the range from 10 μW to 5 mW inclusive.

12. An amplification assembly for amplifying an optical signal which comprises an optical signal source, a semiconductor laser structure, means for coupling the optical signal to be amplified into the active layer of the semiconductor laser structure, and means for passing a driving current through the semiconductor laser structure, the amplified signal being emitted from the active layer in use, wherein the following relationship applies:

$$\lambda_{upper} > \lambda > \lambda_{max}$$

in which

λupper is the longer of the two wavelengths of zero gain at said driving current, for the low power limit of optical power input;

λ is the wavelength of the optical signal to be amplified; and

λmax is the wavelength of the gain maximum, at said driving current, for the low power limit of optical power input.

13. An assembly according to claim 12, wherein $$(\lambda - \lambda_{max})/(\lambda_{upper} - \lambda_{max}) \geq 0.1.$$

14. An assembly according to claim 12, wherein $$(\lambda - \lambda_{max})/(\lambda_{upper} - \lambda_{max}) \geq 0.2.$$

15. An assembly according to any of claims 12 to 14 wherein $\lambda_{max}$ is in the range from 1.2 to 1.7 μm.

16. An assembly according to any of claims 12 to 14 wherein the driving current is such that lasing does not occur.

17. An assembly according to any of claims 12 to 14, wherein the driving current is such that lasing occurs and the wavelength of the optical signal to be amplified is such that injection locking of the laser does not occur.

18. An amplification assembly for amplifying an optical signal which comprises an optical signal source, a semiconductor laser structure, means for coupling the optical signal to be amplified into the active layer of the semiconductor laster structure, and means for passing a driving current through the semiconductor laser structure such that lasing occurs, the wavelength of the signal to be amplified being such that injection locking is avoided and the amplified signal being emitted from the active layer.

19. An amplification assembly for amplifying an optical signal which comprises an optical signal source, a semiconductor laser structure, means for coupling the optical signal to be amplified into the active layer of the semiconductor laser structure, and means for passing a driving current through the semiconductor laser structure such that lasing occurs, the wavelength of the signal to be amplified being such that injection locking is avoided and the amplified signal being emitted from the active layer, wherein means is provided to monitor the output of the semiconductor laser structure at a wavelength or over a wavelength range distinct from that of the amplified signal and a feedback control loop is provided which acts to control the driving current so as at least partly to compensate for the decrease in the monitored output with increased optical input power.

20. An amplification assembly for amplifying an optical signal which comprises an optical signal source, a semiconductor laser structure, means for coupling the optical signal to be amplified into the active layer of the semiconductor laser structure, and means for passing a driving current through the semiconductor laser structure, the amplified signal being emitted from the active layer in use, wherein means is provided to monitor the output of the semiconductor laser structure at a wavelength or over a wavelength range distinct from that of the amplified signal and a feedback control loop is provided which acts to control the driving current so as at least partly to compensate for the decrease in the monitored output with increased optical input power.

21. An assembly according to any one of claims 12, 18 or 20, wherein the signal to be amplified has a power which lies in the range from 1 μW to 5 mW inclusive.

22. An assembly according to any one of claims 12, 18 or 20, wherein the signal to be amplified has a power which lies in the range from 10 μW to 5 mW.

23. An assembly according to any one of claims 12, 18 or 20, wherein the signal to be amplified has a power which lies in the range from 0.5 mW to 5 mW inclusive.

24. An assembly according to any one of claims 12, 18 or 20, wherein the semiconductor laser structure is of a Fabry-Perot type.

* * * * *